US006627355B2

(12) United States Patent
Levinson et al.

(10) Patent No.: US 6,627,355 B2
(45) Date of Patent: Sep. 30, 2003

(54) METHOD OF AND SYSTEM FOR IMPROVING STABILITY OF PHOTOMASKS

(75) Inventors: Harry J. Levinson, Saratoga, CA (US); Fan Piao, Fremont, CA (US); Christopher A. Spence, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 124 days.

(21) Appl. No.: 09/742,970

(22) Filed: Dec. 20, 2000

(65) Prior Publication Data

US 2002/0132171 A1 Sep. 19, 2002

Related U.S. Application Data

(63) Continuation-in-part of application No. 09/357,422, filed on Jul. 20, 1999, now Pat. No. 6,251,545.

(51) Int. Cl.[7] ............................................... G03F 9/00
(52) U.S. Cl. ........................................................ 430/5
(58) Field of Search ........................ 430/5, 322, 323; 428/426; 378/35

(56) References Cited

U.S. PATENT DOCUMENTS

| 4,431,708 A | 2/1984 | Carver et al. ............... 428/641 |
| 5,279,911 A | 1/1994 | Kamon et al. ................. 430/5 |
| 5,308,741 A | 5/1994 | Kemp ........................ 430/312 |
| 5,414,580 A | 5/1995 | Levenson et al. ........... 360/123 |
| 5,422,206 A | 6/1995 | Kamon ........................... 430/5 |
| 5,780,161 A | 7/1998 | Hsu ............................ 428/426 |
| 5,858,580 A | 1/1999 | Wang et al. .................... 430/5 |
| 5,879,866 A | 3/1999 | Starikov et al. ............. 430/395 |
| 6,406,818 B1 * | 6/2002 | Zemen et al. .................. 430/5 |
| 6,444,372 B1 * | 9/2002 | McCullough .................. 430/6 |

FOREIGN PATENT DOCUMENTS

| EP | 265658 | 5/1988 |
| EP | 542519 | 5/1993 |
| EP | 1096312 | 2/2001 |

OTHER PUBLICATIONS

"Characteristics of Deep UV Optics at 193 nm and 157 nm" by Callahan, et al. Society of Photo–Optical Engineers, 1998.

"Metal Film/Diamond Membrane Mask for Excimer Laser Ablation Projection Etching" IBM TECHNICAL DISCLOSURE BULLETIN, vol. 36, No. 11, Nov. 1983 (1983–11), the whole document.

Moreau et al.: "Dielectric Photomasks" IBM Technical Disclosure Bulletin, vol. 13, No. 1, Jun. 1970(1970–06), page 158 XP002207542, the whole document.

Levinson et al., "Improving Resolution in Photolithography with a Phase–Shifting Mask," IEEE Transactions on Electron Devices, vol. Ed.–29, No. 12 Dec. 1982, pgs. 1828–1836.

* cited by examiner

Primary Examiner—S. Rosasco
(74) Attorney, Agent, or Firm—Foley & Lardner (57) ABSTRACT

The present invention provides a method of and system for reducing the absorption of light by opaque material in a photomask. The method includes providing a photomask substrate, and applying an opaque material to one side of the photomask substrate. The interface between the opaque material and photomask substrate reflects at least 80 percent of the light through the photomask.

20 Claims, 6 Drawing Sheets

METHOD OF AND SYSTEM FOR IMPROVING STABILITY OF PHOTOMASKS

CROSS REFERENCE TO RELATED APPLICATIONS

The present application is a continuation-in-part of U.S. Ser. No. 09/357,422, by Levinson, filed Jul. 20, 1999, now U.S. Pat. No. 6,251,545, entitled "Method and System for Improving Transmission of Light Through Photomasks".

FIELD OF THE INVENTION

The present invention relates to semiconductor fabrication. More particularly, the present invention relates to photomasks utilized in semiconductor fabrication lithography.

BACKGROUND OF THE INVENTION

Lithography is conventionally used in the fabrication of semiconductor devices. In optical lithography, a photosensitive film, a photoresist, is patterned by a photomask. Photoresist is exposed to light from a light source through the photomask. An etch or implantation of the wafer may be performed based upon the photoresist pattern.

The photomask has areas composed of an absorbing layer in a pattern which corresponds to the desired circuitry for the device. The absorbing layer can be chromium, or some other opaque or partially transmitting material. Alternative materials to chromium, such as, molybdenum disilicide ($MoSi_2$) have also been pursued in certain photolithographic applications. These alternative materials have been pursued primarily for their better processing capability and for use as attenuated phase-shifting masks, rather than for use as opaque materials.

Figure 1:
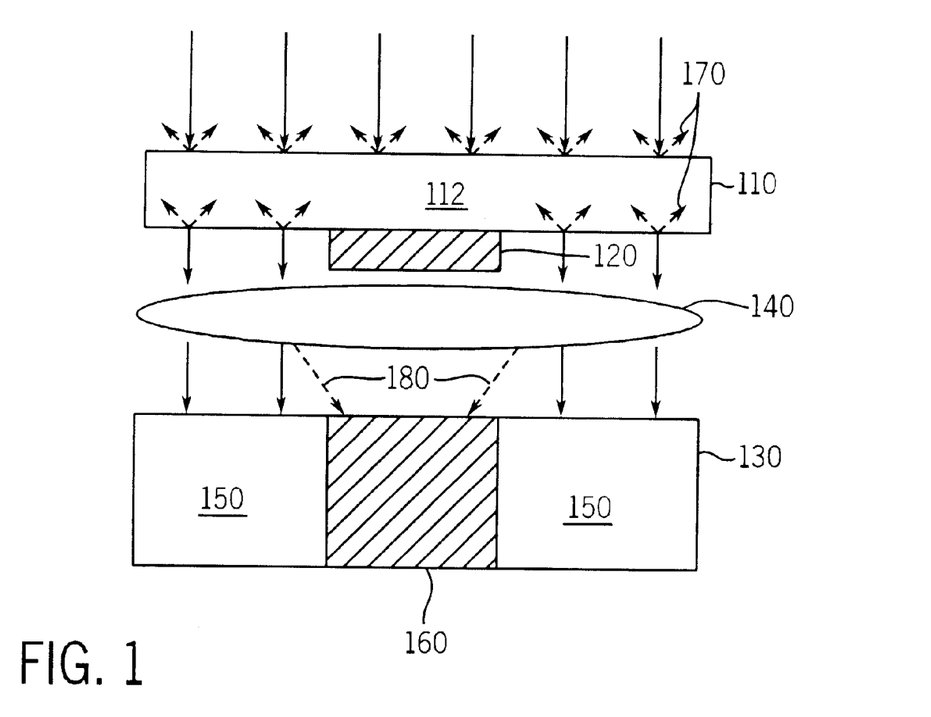
FIG. 1 illustrates a conventional photomask and photoresist as used in lithography.

FIG. 1 illustrates a conventional photomask 110 and photoresist 130 as used in lithography. The photomask 110 may comprise fused silica 112. On the bottom side of the photomask 110 are areas 120. Areas 120 are generally an opaque material such as chromium. The photomask 110 is treated with light (e.g., ultraviolet light) from a light source (not shown). The light shines through the photomask 110 where there are no areas 120. The light is reflected or absorbed where there are areas 120. Some of the light that passes through the photomask 110 continues through a lens 140, which projects an image of the mask pattern onto the photoresist 130, which undergoes a chemical reaction when exposed to light. Portions 150 of the photoresist 130 are exposed to the light while portions 160 of the photoresist 130 are ideally not exposed to the light.

However, approximately 4–5% of the light is lost through reflections off each of the two surfaces of the photomask, as illustrated by arrows 170 in FIG. 1. Light reflected from the substrate or wafer can be transmitted back through the lens and back to the photomask 110. A portion of this light is then reflected by the photomask 110 back to the photoresist 160 on the wafer, as shown by arrows 180. Such reflected light is not part of the integrated image of the photomask 110, and it can degrade the quality of the light pattern in the photoresist 160.

In addition, although conventional absorbing materials, such as, chromium materials, partially reflect ultra-violet (UV) light and partially absorb UV, light they are primarily absorbers. For example, for chromium, approximately 30% of light at the interface between area 120 and fused silica 112 is reflected. The remaining 70% of the light is absorbed by area 120.

Absorption of a significant amount of light by area 120 can heat photomask 110, thereby resulting in substantial registration errors. Calculations performed by the University of Wisconsin predict a nearly eighty nanometer (nm) registration error due to light absorption by the absorbing layer (area 120). Approximately fifty percent of this error cannot be corrected using conventional means while the remaining fifty percent of this error can only be corrected by reducing exposure tool productivity. Anti-reflective coatings utilized on absorbing layers in conventional semiconductor fabrication processes can exacerbate the heating problem because the conventional anti-reflective coatings reduce reflection through absorption.

Accordingly, what is needed is a system for and method of improving the transmission of light through photomasks. The method and system should decrease the loss of light due to reflections and decrease undesired exposure of portions of the photoresist. Further, there is a need for a method of and a system for reducing heat absorbed by the photomask. Even further, there is a need for a method of and a system for decreasing registration errors associated with the photomask.

SUMMARY OF THE INVENTION

One exemplary embodiment relates to a method of forming a photomask. The photomask is utilized in an integrated circuit fabrication process. Light is transmitted through the photomask. The method includes providing a photomask substrate and applying an opaque material to at one side of the photomask substrate. A reflection of the light at an interface between the substrate and the opaque material is at least 45% and absorption by the opaque material is reduced with respect to conventional photomasks.

Another exemplary embodiment relates to a system. The system includes a photomask substrate, an opaque material, and at least one anti-reflective coating. The opaque material is on one side of the photomask substrate. At least one anti-reflective coating is on an other side of the photomask substrate. A reflection at an interface between the opaque material and the substrate is 45% or greater.

Yet another exemplary embodiment relates to a method of transmission of light through a photomask. The method includes steps of providing a photomask substrate, applying an anti-reflective coating to a first side of the photomask substrate, and applying an opaque coating to a second side of the photomask substrate. The opaque coating includes molybdenum.

Still another exemplary embodiment relates to a system for use with light in a photographic process. A system includes a photomask substrate, and an opaque material on one side of the photomask substrate. The light has a reflectance of 45% or greater at an interface between the photomask substrate and the opaque material.

Yet another exemplary embodiment relates to a system including a photomask substrate and a opaque means for defining a pattern on the substrate, reducing light absorption.

BRIEF DESCRIPTION OF THE DRAWINGS

Exemplary embodiments will hereafter be described with reference to the accompanying drawings, wherein like numerals denote like elements and.

DETAILED DESCRIPTION OF THE EXEMPLARY EMBODIMENTS

A system and method for improving the transmission of light through photomasks is disclosed. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 2:
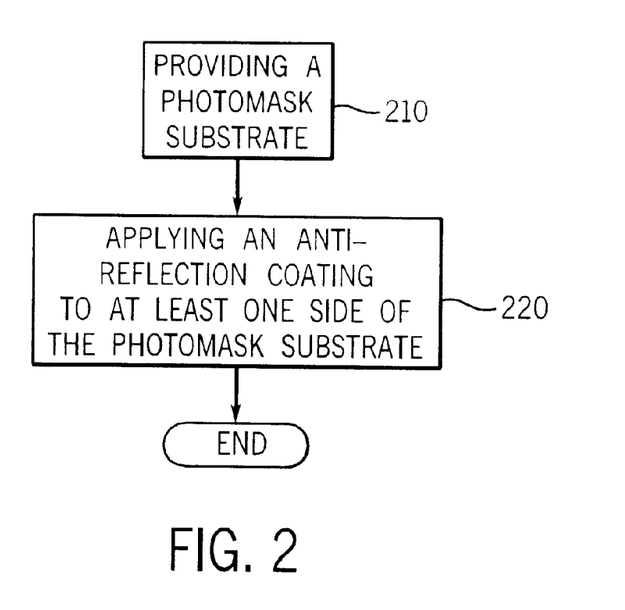
FIG. 2 is a flowchart illustrating a method for improving the transmission of light through photomasks.

FIG. 2 is a flowchart illustrating a method for improving the transmission of light through photomasks in accordance with an exemplary embodiment. First, a photomask substrate is provided, via step 210. The photomask substrate may comprise fused silica or some other material. An anti-reflection coating is applied to at least one side of the photomask substrate, via step 220. An opaque or attenuating film may then be applied to one side, forming a photomask blank. The photomask blank is then patterned to form the photomask. Light transmitted through the photomask substrate with the anti-reflection coating(s) suffer less loss of light due to reflections. This increases the efficiency of the lithography. The amount of undesired exposure of a photoresist (not shown) is decreased as well. The anti-reflection coating can be a single film, usually comprising materials, such as $CaF_2$, $MgF_2$, $DyF_3$, $LaF_3$, $Na_3AlF_6$, $YF_3$, and $Al_2O_3$, although not limited to these materials. The anti-reflection coating may also be a multilayer film comprising these and other materials, sometimes along with $SiO_2$.

The reflection from light normally incident on a thick planar material is given by:

$$R = \left(\frac{n-1}{n+1}\right)^2$$

wherein n is the index of refraction of the material. For fused silica, n=1.5 to 1.7 for wavelengths between 248 nm and 157 nm, which is the wavelength range of interest for lithography. Accordingly, the reflection from a single surface of the fused silica is 4%–7%. In a lithography application, between 8% and 14% of the light is lost from simple reflections from the two surfaces of the photomask. The application of anti-reflection coating(s) can reduce this reflectance to less than 0.5% per surface. This can enhance lithography productivity significantly.

For a single anti-reflecting film, the relationship between the thickness of the film d, the wavelength of the light λ and the index of refraction $n_{ARC}$ of the material is given by the formula below, where k is a non-negative integer:

$$d = \frac{(2k+1)\lambda}{4n_{ARC}}$$

Figure 3:
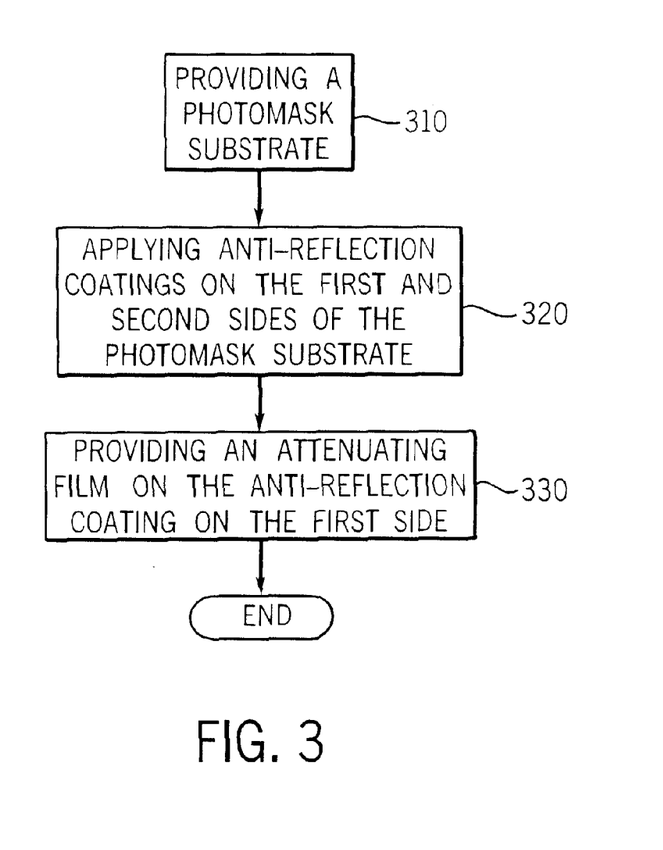
FIG. 3 is a flowchart illustrating a first exemplary embodiment of the method for improving the transmission of light through photomasks.
Figure 4:
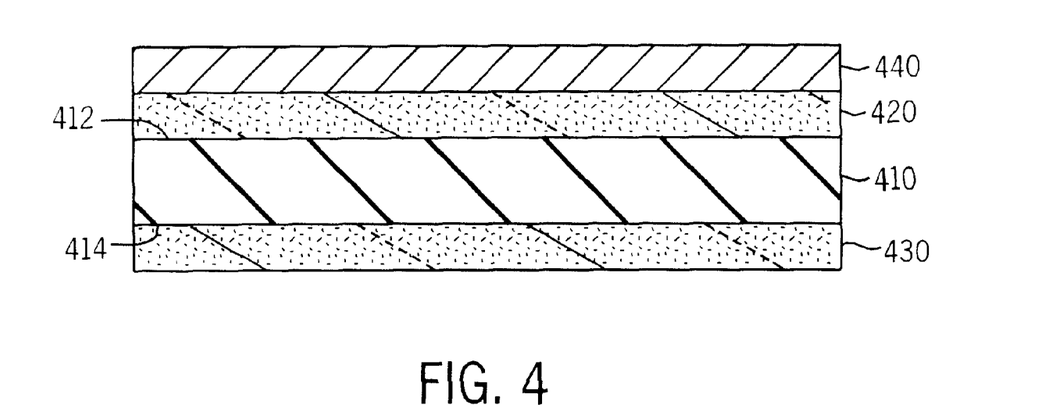
FIG. 4 illustrates a photomask blank provided by the first exemplary embodiment of the method illustrated in FIG. 3.

FIG. 3 is a flowchart illustrating a first exemplary embodiment of a method for improving the transmission of light through photomasks. FIG. 4 illustrates a photomask blank provided by the first exemplary embodiment of the method as illustrated in FIG. 3. First, a photomask substrate 410 is provided, via step 310. The photomask substrate 410 may comprise fused silica and has a first (top) side 412 and a second (bottom) side 414. Anti-reflection coatings 420 and 430 are applied to first and second sides 412, 414 of photomask substrate 410, respectively, via step 320. Then, an attenuating or opaque film 440 may be provided on top of the anti-reflection coating 420 the first side 412, via step 330. The opaque or attenuating film 440 is patterned in correspondence to the desired circuitry for the device. In the first exemplary embodiment, reflections from both sides of the photomask are decreased.

Figure 5:
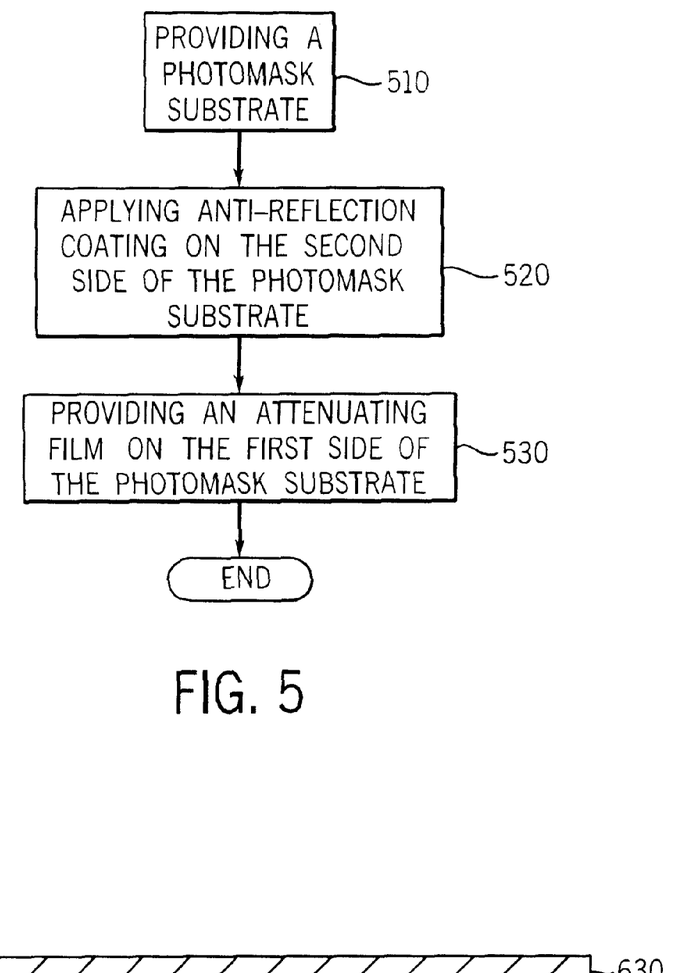
FIG. 5 is a flowchart illustrating a second exemplary embodiment of the method for improving the transmission of light through photomasks.
Figure 6:
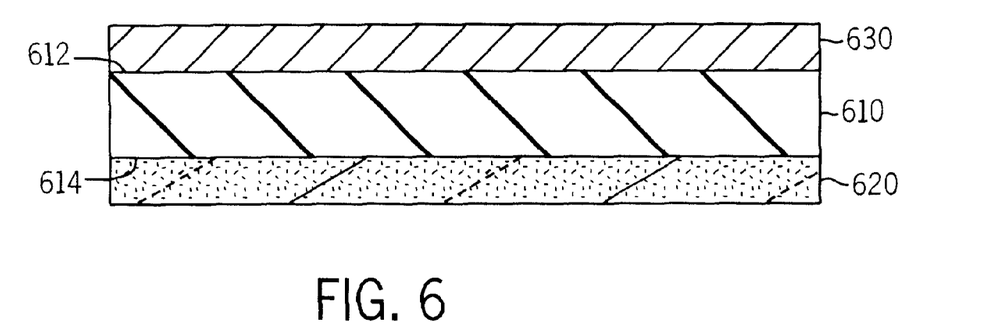
FIG. 6 illustrates a photomask blank provided by the second exemplary embodiment of the method illustrated in FIG. 5.

However, there may be an occasion where the anti-reflection coating is not compatible with the etching of the attenuating film. In this situation, the second exemplary embodiment of the present invention, as illustrated in FIGS. 5 and 6, may be used. FIG. 5 is a flowchart illustrating a second exemplary embodiment of the method for improving the transmission of light through photomasks. FIG. 6 illustrates a photomask blank provided by the second exemplary embodiment of the method illustrated in FIG. 5. First, a photomask substrate 610 is provided, via step 510. An anti-reflection coating 620 is applied to a second side 614 of photomask substrate 610, via step 520. Then, an attenuating film 630 is; provided on a first side 612 of photomask substrate 610, via step 530. In the second exemplary embodiment, the integrity of attenuating film 630 is maintained while reflections from second side 614 of photomask substrate 610 are decreased. The efficiency of the lithography is still improved over conventional photomasks with the second exemplary embodiment.

There may also be an occasion where there is concern about the scratching of the anti-reflection coating which is applied to the second side of the photomask. Typically, the scratching of the second side of the photomask is not a concern due to the hardness of silica. However, the anti-reflection coating is easily scratched during the handling of the photomask. In this occasion, the third exemplary embodiment, as illustrated in FIGS. 7 and 8, may be used.

Figure 7:
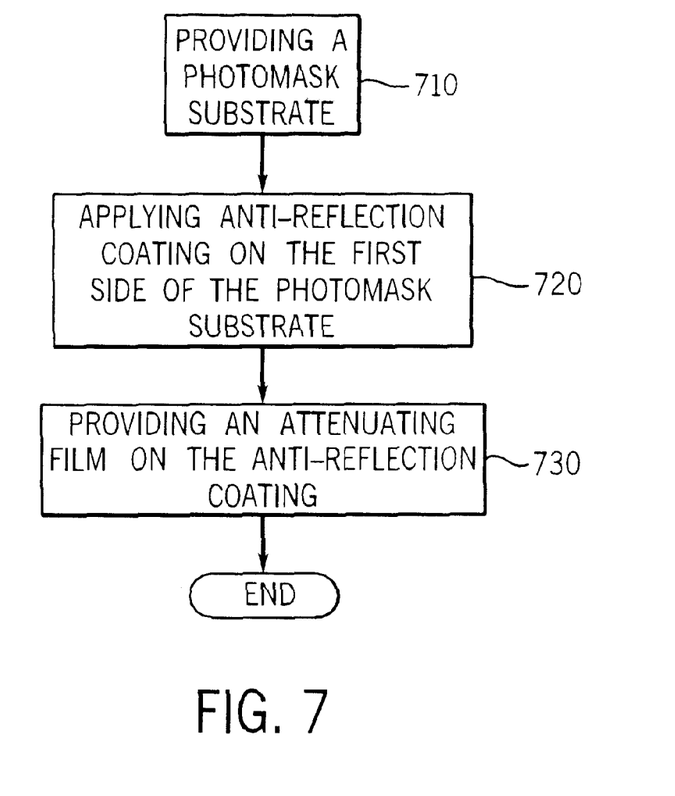
FIG. 7 is a flowchart illustrating a third exemplary embodiment of the method for improving the transmission of light through photomasks.
Figure 8:
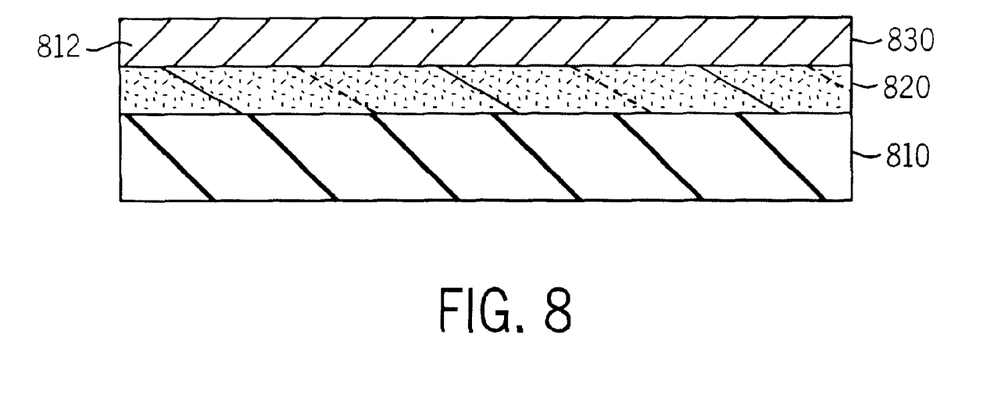
FIG. 8 illustrates a photomask blank provided by the third exemplary embodiment of the method illustrated in FIG. 7.

FIG. 7 is a flowchart illustrating a third exemplary embodiment of the method for improving the transmission of light through photomasks. FIG. 8 illustrates a photomask blank provided by the third exemplary embodiment of the method illustrated in FIG. 7. First, a photomask substrate 810 is provided, via step 710. An anti-reflection coating 820 is applied to a first side 812 of the photomask substrate 810 via step 720. Then, an attenuating film 830 may be provided on the anti-reflection coating 820, via step 730. In the third exemplary embodiment, reflections from first side 812 of photomask substrate 810 are decreased. Because there is no anti-reflection coating on the second side, there is no cause for concern about scratching the coating. The efficiency of the lithography is still improved over conventional photomasks with the third exemplary embodiment.

Figure 9:
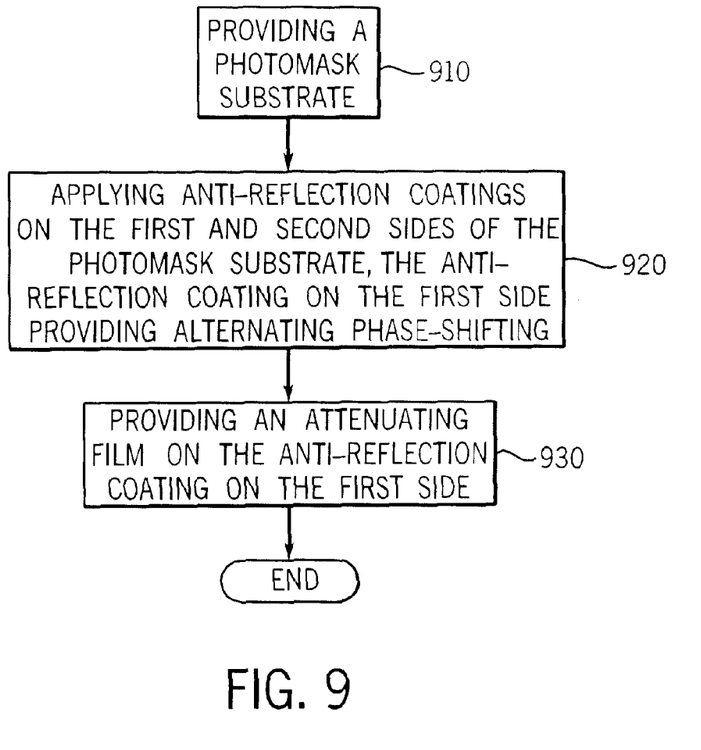
FIG. 9 is a flowchart illustrating a fourth exemplary embodiment of the method for improving the transmission of light through photomasks.
Figure 10:
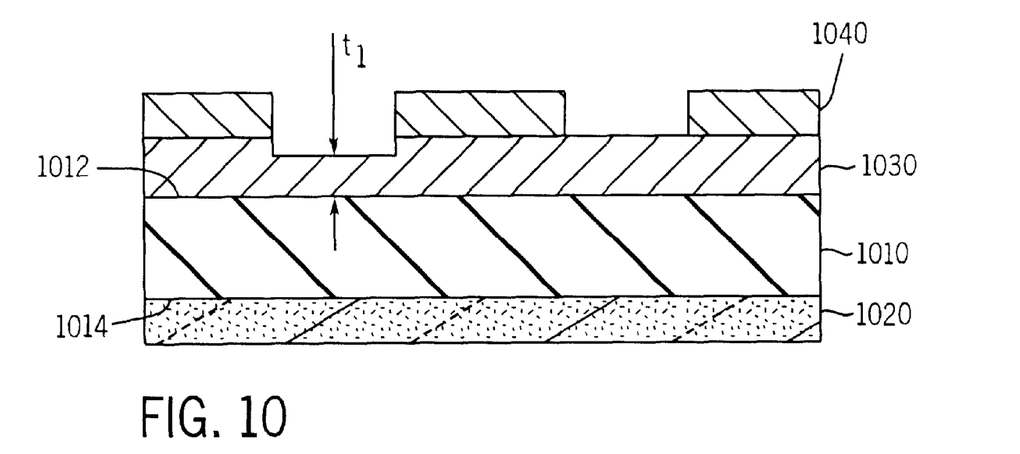
FIG. 10 illustrates a photomask blank provided by the fourth exemplary embodiment of the method illustrated in FIG. 9.

The principles described herein may also be used for alternating phase-shifting photomasks, as illustrated in FIGS. 9 and 10. Alternating phase-shifting photomasks are well known in the art and will not be discussed in detail here. FIG. 9 is a flowchart illustrating a fourth exemplary embodiment of the method for improving the transmission of light through photomasks. FIG. 10 illustrates a photomask provided by the fourth exemplary embodiment of the method illustrated in FIG. 9. First, a photomask substrate 1010 is provided, via step 910. Anti-reflection coatings 1020 and 1030 are applied to first and second sides 1012, 1014 of photomask substrate 1010, respectively, via step 920. Anti-reflecting coating 1030 also serves as the alternating phase-shifting film. Then, an attenuating film 1040 may be provided on the alternating phase-shifting film 1030, via step 930. In the fourth exemplary embodiment, the alternating phase-shifting film 1030 provides anti-reflection capabilities and 180° phase-shifting to the light. This is accomplished by satisfying the following equations:

$$t_1 = \frac{(2m+1)\lambda}{4n}$$

$$t_2 - t_1 = \frac{(2k+1)\lambda}{4n}$$

$$= \frac{\lambda}{2(n-1)}$$

where m and k are non-negative integers, and n is the index of refraction of alternating phase-shifting film 1030. $t_1$ and $t_2$ are the thickness of the alternating phase-shifting film 1030 beside the attenuating film 1040 as illustrated in FIG. 10. The area with $t_2$ thickness is a 180° phase shifting area is the wavelength of light. From the last two equations, the following result is obtained:

$$n = \frac{2k+1}{2k-1}$$

When k=3, n=1.4. This can be approximately satisfied with light at 157 nm wavelength for $MgF_2$ (n=1.47) and LiF (n=1.49).

Methods of and systems for improving the transmission of light through photomasks have been disclosed. At least one anti-reflection coating is applied to a side of the photomask. The anti-reflection coating reduces the loss of light during lithography due to reflections. This increases the efficiency of the lithography. Some embodiments have the added advantage of reducing the amount of undesired exposure of a photoresist due to scatter.

Figure 11:
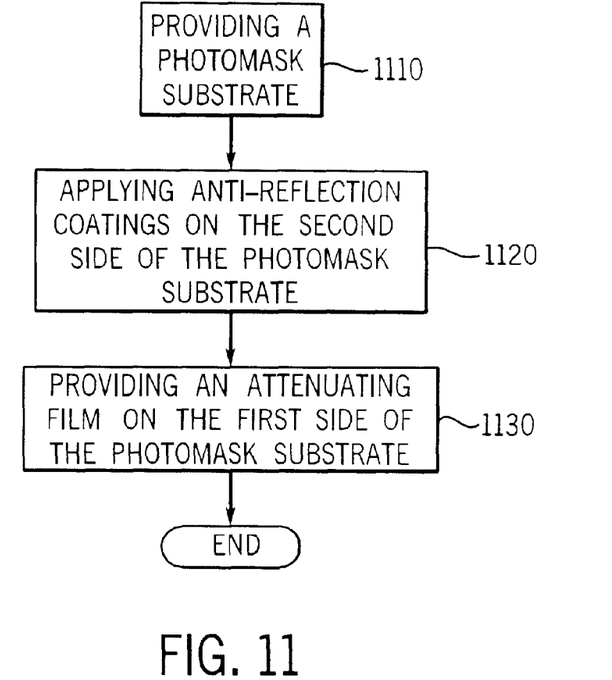
FIG. 11 is a flowchart illustrating a preferred embodiment of a method for manufacturing a photomask having improved stability.
Figure 12:
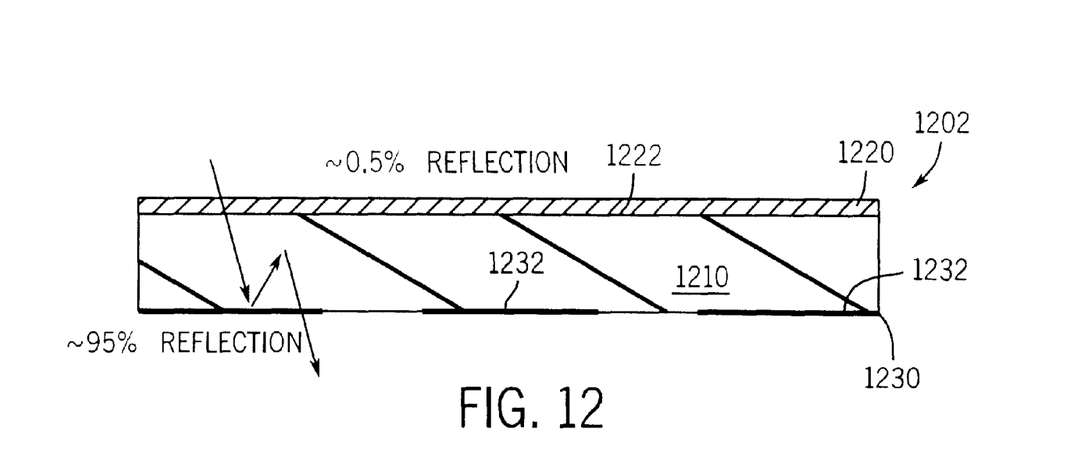
FIG. 12 illustrates a photomask blank provided by the method illustrated in FIG. 11.

With reference to FIGS. 11 and 12, the manufacture and use of a photomask optimized for reduced light absorption is described below. In FIG. 11, at a step 1110, a photomask substrate 1210 is provided. Preferably, photomask substrate 1210 is a 6.35 millimeter, 9 millimeter, or other standard thickness glass or fused silica material. At a step 1120, an anti-reflective coating layer 1220 can be provided on a side of substrate 1210. Anti-reflective coating layer 1220 can be a fluoride material. For example magnesium fluoride ($MgF_2$), calcium fluoride ($CaF_2$), lithium fluoride (LiF), hafnium fluoride ($HfF_4$), etc. are suitable materials for layer 1220. Layer 1220 preferably has a thickness equal to:

$$\frac{(2k+1)\lambda}{4n_{ARC}}$$

The wavelength of the photolithographic light is preferably 450 nm or less. Layer 1220 can be a single layer or composite layer similar to coating 420 or 430 discussed with reference to FIGS. 3 and 4.

At a step 1130, an opaque material or absorbing material layer 1230 is provided on the side opposite layer 1220 of substrate 1210. Layer 1230 can be a 200–1000 Å (preferably 500 Å or less) thick layer. Layer 1230 preferably does not include highly absorptive materials, such as, chromium.

Layer 1230 can comprise a single layer or multiple layers of a number of materials. Exemplary materials for layer 1230 include molybdenum (Mb) and tungsten (W). In other embodiments, compound materials and composite materials can be utilized for layer 1230. Examples of a multiple layer stack for layer 1230 utilize alternating layers or films of molybdenum, fluorides, and silicon dioxide.

Layer 1220 is preferably provided on the side of substrate 1210 closest to the light source. Layer 1230 is preferably provided on the side of substrate 1210 closest to the integrated circuit (farthest from the light source). Alternatively, layer 1220 can be farthest from the light source and layer 1230 can be closest to the light source.

Layer 1230 is preferably chosen to be optimized for a large amount of reflectance at the wavelength of the light utilized in the semiconductor fabrication process. For example, layer 1230 is preferably chosen to have superior reflectivity (45% or more) at an ultraviolet light wavelength such as 157 nanometers. Preferably, the reflectance of the light at an interface 1232 between substrate 1210 and layer 1230 is 80% or greater, more preferably 90% or greater. Most preferably, the reflectance is approximately 95% or greater. The high reflectance significantly reduces the amount of light energy absorbed by photomask 1202, thereby reducing the unwanted affects of heating photomask 1202.

Although the use of layer 1230, which is highly reflective, as the opaque material may increase the degradation of images from reflective light, this problem can be reduced significantly by utilizing the principles described with reference to FIGS. 1–10. For example, utilizing anti-reflective coating layer 1220 reduces the amount of reflection at an interface 1222 between substrate 1210 and coating 1220. Preferably, the reflection at interface 1222 is less than approximately 0.5%. Layer 1220 generally does not contribute to heating because it is not a significantly absorbing material, in contrast to conventional anti-reflective coatings utilized on metal surfaces and in semiconductor fabrication processes. In one alternative, photomask 1202 can be produced without the use of anti-reflective coating 1220.

The order of steps 1110, 1120 and 1130 are not shown or described in limiting fashion. Photomask 1202 provides significant advantages over conventional photomasks which would typically have no more than a 30% reflection at interface 1232 and a 4 to 5% reflection at the side opposite layer 1230 of substrate 1210. Thus, the use of a photomask including layer 1220 can increase stepper throughput and image quality.

It is understood that while preferred embodiments and specific examples are given, they are for the purpose of illustration only. The present invention is defined by the following claims and is not limited to the precise details disclosed. For example, for the anti-reflective coating, materials other than those described can be utilized. Various modifications may be made in the details within the scope and range of the equivalence of the claims without departing from what is claimed.

What is claimed is:

1. A method of forming a photomask, the photomask being utilized in an integrated circuit fabrication process, wherein light is transmitted through the photomask, the method comprising:

providing a photomask substrate; and applying an opaque material to at least one side of the photomask substrate, the opaque material including at least one of molybdenum and tungsten wherein a reflection of the light at an interface between the substrate and opaque material is at least 45 percent and absorption by the opaque material is reduced.

2. The method of claim 1, further comprising:

applying at least one anti-reflective coating to at least one side of the photomask substrate.

3. The method of claim 2, wherein the antireflective coating is applied to an opposite side of the photomask substrate than the opaque material.

4. The method of claim 1, wherein the opaque material is a non-chromium and non-aluminum substance.

5. The method of claim 4, wherein the opaque material includes molybdenum.

6. The method of claim 1, wherein the opaque material includes tungsten.

7. The method of claim 1, wherein the reflection of the light at the interface is over 45 percent, wherein the light has a wavelength at 157 nm.

8. A system comprising:

a photomask substrate;

an opaque material on one side of the photomask substrate, the opaque material including at least one of molybdenum and tungsten; and at least one anti-reflection coating on another side of the photomask substrate, wherein a reflection of light at an interface between the photomask substrate and the anti-reflection coating is reduced and a reflection of light at an interface between the opaque material and the substrate is 45 percent or greater.

9. The system of claim 8, wherein the opaque material includes molybdenum.

10. The system of claim 8, further comprising:

a light source for providing light at a wavelength between 140 and 450 nm.

11. The system of claim 8, wherein the opaque material is a compound structure.

12. The system of claim 8, wherein the opaque material includes at least three layers.

13. A method of transmitting light through a photomask, comprising the steps of:

providing a photomask substrate;

applying an anti-reflective coating to a first side of the photomask substrate; and applying an opaque coating to a second side of the photomask substrate, wherein the opaque coating reflects at least 45 percent of light striking an interface between the opaque coating and the substrate, the opaque coating including at least one of molybdenum and tungsten.

14. The method of claim 13, wherein the opaque coating does not include chromium.

15. The method of claim 13, wherein UV light has a 95 percent or greater reflection at the interface between the substrate and the opaque material.

16. The method of claim 13, wherein UV light has a 0.5 percent or less reflection at an interface between the photomask substrate and the anti-reflective coating.

17. A system for use with light in a photolithographic process, the system comprising:

a photomask substrate; and an opaque material on one side of the photomask substrate, wherein the light has a reflectance of 45 percent or greater at an interface between the photomask substrate and the opaque material, the opaque material including at least one of molybdenum and tungsten.

18. The system of claim 17, wherein the opaque material is 200–1000 Å thick.

19. The system of claim 18, wherein the opaque material includes molybdenum.

20. A system, comprising:

a photomask; and an opaque means for defining a pattern on the photomask, wherein an interface between the opaque means and the photomask reflects 45 percent or more of light striking the interface, whereby light absorption is reduced, the opaque means including at least one of molybdenum or tungsten.

* * * * *